(12) United States Patent
Burkhart

(10) Patent No.: US 6,421,390 B1
(45) Date of Patent: Jul. 16, 2002

(54) HIGH-SPEED PULSE-SHAPE GENERATOR, PULSE MULTIPLEXER

(75) Inventor: Scott C. Burkhart, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 08/579,623

(22) Filed: Dec. 26, 1995

(51) Int. Cl.[7] ................................................ H04B 3/00
(52) U.S. Cl. ...................................................... 375/257
(58) Field of Search ................................ 375/257, 242; 327/100, 104, 105, 166, 172, 173, 174, 176; 333/12, 17.3, 32

(56) References Cited

U.S. PATENT DOCUMENTS

| | | | |
|---|---|---|---|
| 3,743,966 A | * 7/1973 | Grace et al. ................ 331/101 |
| 4,388,725 A | * 6/1983 | Saito et al. ................. 375/257 |
| 4,450,419 A | * 5/1984 | Schwarzmann ............. 333/164 |
| 4,667,161 A | 5/1987 | Wilcox ....................... 328/65 |
| 4,928,316 A | 5/1990 | Heritage et al. ............ 455/600 |
| 5,023,574 A | * 6/1991 | Anklam et al. .............. 333/20 |
| 5,038,051 A | * 8/1991 | Firman et al. .............. 307/106 |
| 5,166,818 A | 11/1992 | Chase et al. ................ 359/170 |
| 5,263,039 A | 11/1993 | Skupsky et al. ............. 372/25 |
| 5,384,798 A | 1/1995 | Zucker et al. ............... 372/26 |
| 5,394,415 A | 2/1995 | Zucker et al. ............... 372/26 |
| 5,408,497 A | * 4/1995 | Baumann et al. ........... 375/257 |
| 5,448,417 A | 9/1995 | Adams ........................ 359/856 |
| 5,483,100 A | * 1/1996 | Koide et al. ................ 375/257 |
| 5,485,488 A | * 1/1996 | Van Brunt et al. .......... 375/257 |
| 5,502,392 A | * 3/1996 | Arjavalingam et al. ..... 324/638 |
| 5,654,981 A | * 8/1997 | Mahant-Shetti et al. .... 375/257 |

OTHER PUBLICATIONS

Statz et al., GaAs FET Device and Circuit Simulation in SPICE, IEEE Transactions On Electron Devices, vol. Ed–34, No. 2, Feb. 1987.

* cited by examiner

*Primary Examiner*—Don N. Vo
(74) *Attorney, Agent, or Firm*—John P. Wooldridge; Alan H. Thompson

(57) ABSTRACT

The invention combines arbitrary amplitude high-speed pulses for precision pulse shaping for the National Ignition Facility (NIF). The circuitry combines arbitrary height pulses which are generated by replicating scaled versions of a trigger pulse and summing them delayed in time on a pulse line. The combined electrical pulses are connected to an electro-optic modulator which modulates a laser beam. The circuit can also be adapted to combine multiple channels of high speed data into a single train of electrical pulses which generates the optical pulses for very high speed optical communication. The invention has application in laser pulse shaping for inertial confinement fusion, in optical data links for computers, telecommunications, and in laser pulse shaping for atomic excitation studies. The invention can be used to effect at least a 10× increase in all fiber communication lines. It allows a greatly increased data transfer rate between high-performance computers. The invention is inexpensive enough to bring high-speed video and data services to homes through a super modem.

10 Claims, 4 Drawing Sheets

HIGH-SPEED PULSE-SHAPE GENERATOR, PULSE MULTIPLEXER

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to electrical pulse shaping, and more specifically, it relates to the combination of arbitrary amplitude high-speed pulses for precision pulse shaping to control the temporal profile of laser pulses.

2. Description of Related Art

Very short, high voltage electrical pulses are needed to control the temporal profile of laser pulses using Pockels cells in applications such as inertial confinement fusion. Pulse shaping is required in high energy pulsed lasers to compensate for gain saturation which distorts the output laser pulse. In addition, pulse shaping is desirable for improved target performance in fusion experiments. In the Nova Laser System at Lawrence Livermore National Laboratory (LLNL), the master oscillator pulse is modulated in time using a dual Pockels cell system which requires a shaped 4 kV pulse. While this works very well, the main disadvantage is that the shaping technique relies upon the reflection from non-uniform impedance transmission lines, which is not conducive to programmable control. Pulse shaping in this way began in the early 1980s using approximate models and experimental methods.

In the late 1980s, techniques were developed for systematic design of non-uniform transmission lines to obtain predetermined pulse shapes, but these methods were not computer controllable. A major change in master oscillator technology occurred with the Beamlet Laser System at LLNL, which used integrated optoelectronic modulators (EO modulators) to control the temporal pulse shape of the laser beam. These devices only require 8 volts to operate, opening up other possibilities for pulse shaping.

SUMMARY OF THE INVENTION

It is an object of the present invention to combine arbitrary amplitude high-speed pulses to achieve precision pulse shaping for control of the temporal profile of laser pulses.

A programmable pulse shape generator combines arbitrary high-speed electrical pulses for precision laser pulse shaping. The circuitry combines arbitrary height pulses which are generated by replicating scaled versions of a trigger pulse and summing them, delayed in time, on a pulse line. The combined electrical pulses are connected to an electro-optic modulator which modulates the light. The circuit can also be adapted to combine multiple channels of high speed data, multiplexing them into a single train of electrical pulses which generates the optical pulses for very high speed optical communication. The invention has application in laser pulse shaping for inertial confinement fusion, in optical data links for computers, telecommunications, and in laser pulse shaping for atomic excitation studies. The invention can be used to effect a 10× increase in all fiber communication lines. It allows a greatly increased data transfer rate between high-performance computers. The invention is inexpensive enough to bring high-speed video and data services to homes through the equivalent of a super modem.

This pulse shaping module will be used to shape the electrical pulses which shape the laser pulse for the National Ignition Facility (NIF) at LLNL. It is currently being used there to shape pulses for the Beamlet laser. The invention can modulate light at 9 giga-samples per second (9 GS/s) without being optimized for higher speeds. This circuit topology can operate at speeds of 20 GS/s and beyond, to vastly increase the capability of short-haul fiber optic communication systems. In addition, it can be used in long-haul transmission systems to pre-shape the data pulse stream to compensate for path distortions (much like the path distortions experiences in Nova or NIF).

DETAILED DESCRIPTION OF THE INVENTION

Figure 1:
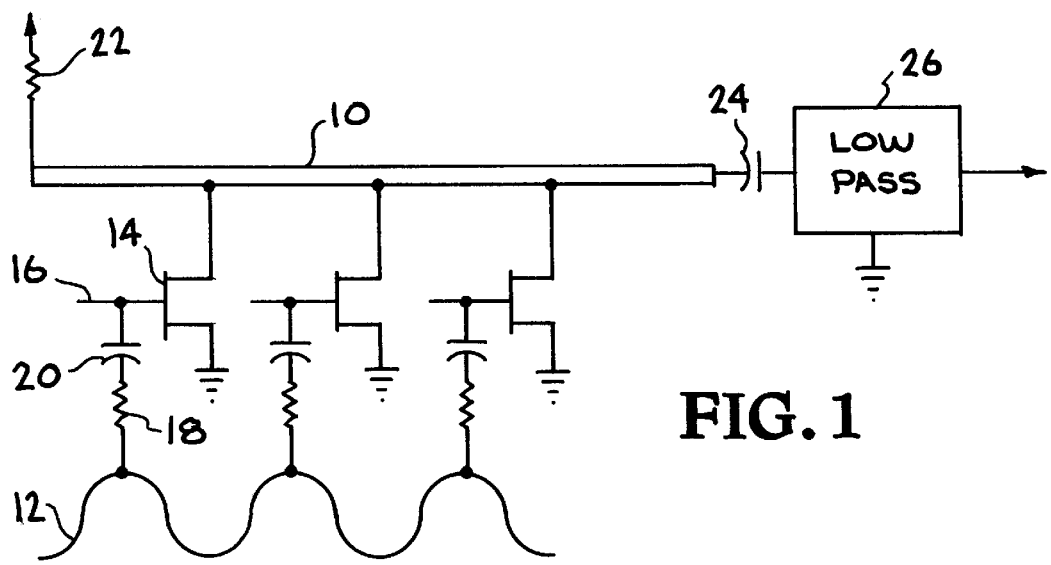
FIG. 1 shows three sections of the pulse shaping system.

The basic architecture of the invention may be described as a chain of high speed microwave transistors, triggered in sequence, to impart electrical current impulses of varying amplitude upon a charged pulse line. The size of each current impulse is determined by a bias voltage, which allows rapid reprogramming of the pulse shape. This circuit has been simulated using the well known circuit simulation code SPICE. The basic circuit design is shown FIG. 1. The two transmission lines shown consist of the pulse line 10 and the trigger line 12. The pulse line is periodically connected to ground through a Gallium-Arsenide Metal-Semiconductor Field Effect Transistor 14 (GaAs MESFET 14) which is a widely used microwave frequency transistor. All of the MESFETs are biased in the off state, which is typically −2V to −4V relative to the MESFET source (the lower terminal connected to ground). For the devices used here (e.g., Mitsubishi MGF1801 MESFETs), the turn-off voltage is nominally −2.5V. To initiate operation, a pulse of 270 FWHM at 5−10V is launched on the trigger line 12 and propagated past each MESFET 14. Each MESFET gate 16 is fed 1V of the trigger pulse through the tap resistor 18 connected to the trigger line 12, and the 1V pulse is transmitted through the blocking capacitor 20 directly to the MESFET gate 16. This is the point where the programmability of this design exists, because the MESFET is turned on in proportion to the initial voltage of the gate bias. If the gate bias is initially −3.5V, the 1V pulse from the trigger line has no effect since the gate-source voltage never exceeds the cut off voltage of −2.5V. On the other hand, if the bias voltage is initially −2.5V, the trigger pulse raises the gate to −1.5V, taking it from saturation to the linear region, and pulling the pulse line down from 4V to about 0.9V. When current is extracted from the pulse line 10, a voltage pulse or wavelet travels in both directions, the left traveling wave going to the termination resistor 22, and the right traveling wave becoming a part of the shaped pulse which is being constructed from these wavelets. FIG. 1 shows a capacitor 24 and low pass filter 26 connected to the output end of pulse line 10.

Figure 2:
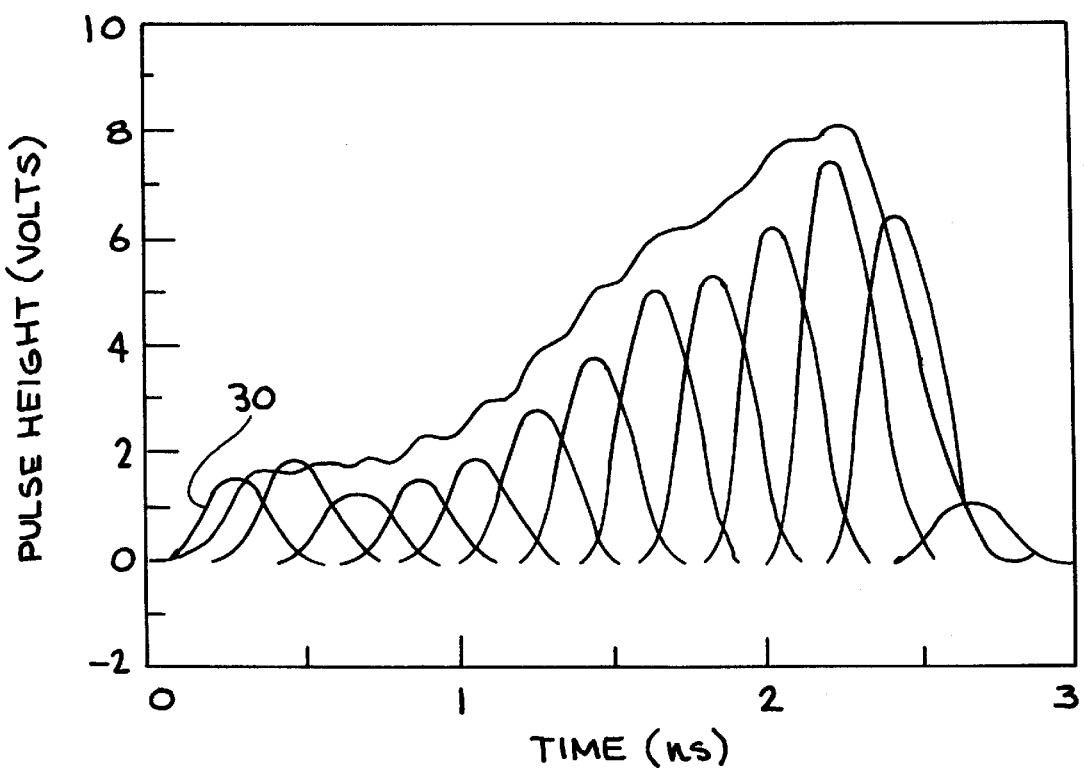
FIG. 2 shows the superposition of adjustable height pulses.

The shaped pulse is built up as shown in FIG. 2. The first wavelet becomes the rising edge 30 of the initial shaped pulse. The trigger line delay is 280 ps between MESFETs as compared to the 30 ps along the pulse line. Thus, after each wavelet is added to the shaped pulse, it propagates entirely past the next MESFET, which is triggered at such a time to add on the next part of the shaped pulse on the trailing edge. In this way, the pulse is assembled until the desired pulse shape has been generated. The pulse propagates through the DC blocking capacitor 24, and through the maximally linear phase (Bessel) low pass filter 26, shown in FIG. 1, to remove the ripples from the wavelet addition. The final shaped pulse propagates to an integrated electro-optical modulator, identical in purpose to the Nova pulse shaping Pockels cell, and identical to the modulator used on Beamlet.

Figure 3:
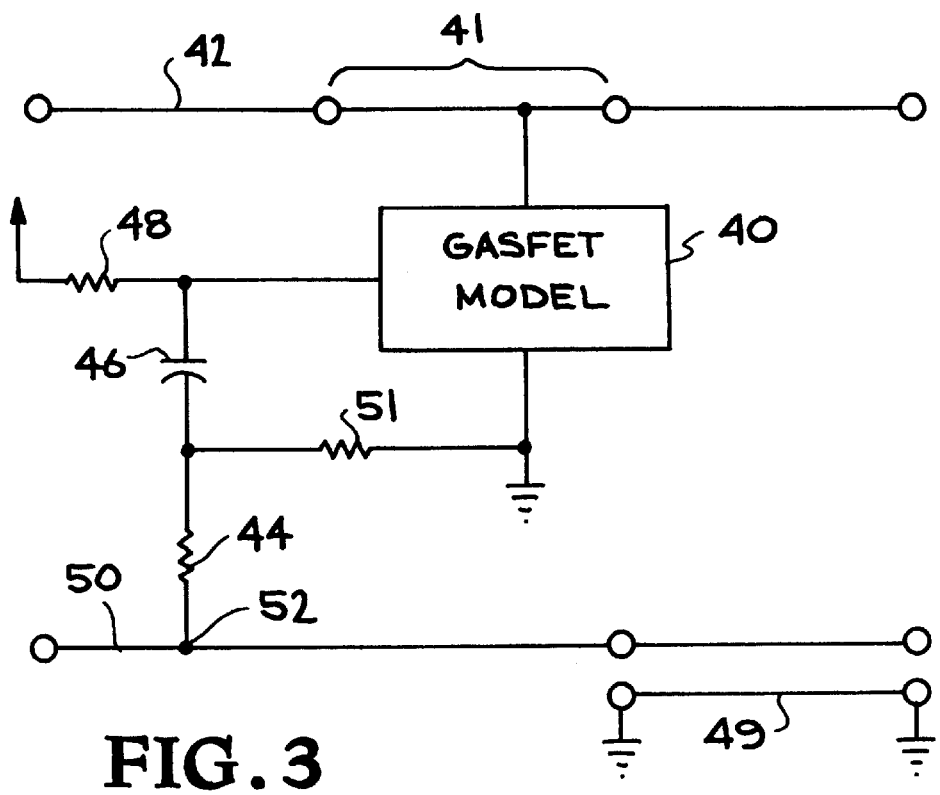
FIG. 3 shows a single sub-circuit of the pulse shaping circuit.

FIG. 3 shows the circuit model of the basic building block for one impulse generator. For the purposes of this model, the gasfet model 40 is a triggerable current sink connected to the pulse transmission line 42. A pulse generator of arbitrary length, limited only by attenuation of the trigger pulse, is built up by cascading this basic stage. Pulse generation is initiated when the trigger pulse arrives at the coupling resistor 44 and a small amount of the trigger pulse is coupled through the capacitor 46 to the gasfet. At this point, the gasfet is turned on, to a degree determined by the bias voltage at resister 48. The trigger pulse is then replicated onto the pulse line 42 with the bias voltage controlled amplitude. The pulse which travels to the right, passes on to the next circuit with minimal delay, however the trigger pulse is delayed by 280 ps. Because of this delay, the next circuit generates its pulse just after this pulse has passed by. The trigger signal level for each subsequent pulse stage is maintained by matching the trigger line in the forward direction at each tee 52. Thus the trigger line impedance increases with every subsequent pulse stage. The length of segment 41 is chosen such that it is possible to compensate for parasitics. Segment 49 is the temporal resolution delay, amd is typically equal to the trigger pulse FWHM. Resistor 51 is an optional impedence matching resistor. Resistor is a tap resistor and or this segment could comprise zero ohms.

Figure 4:
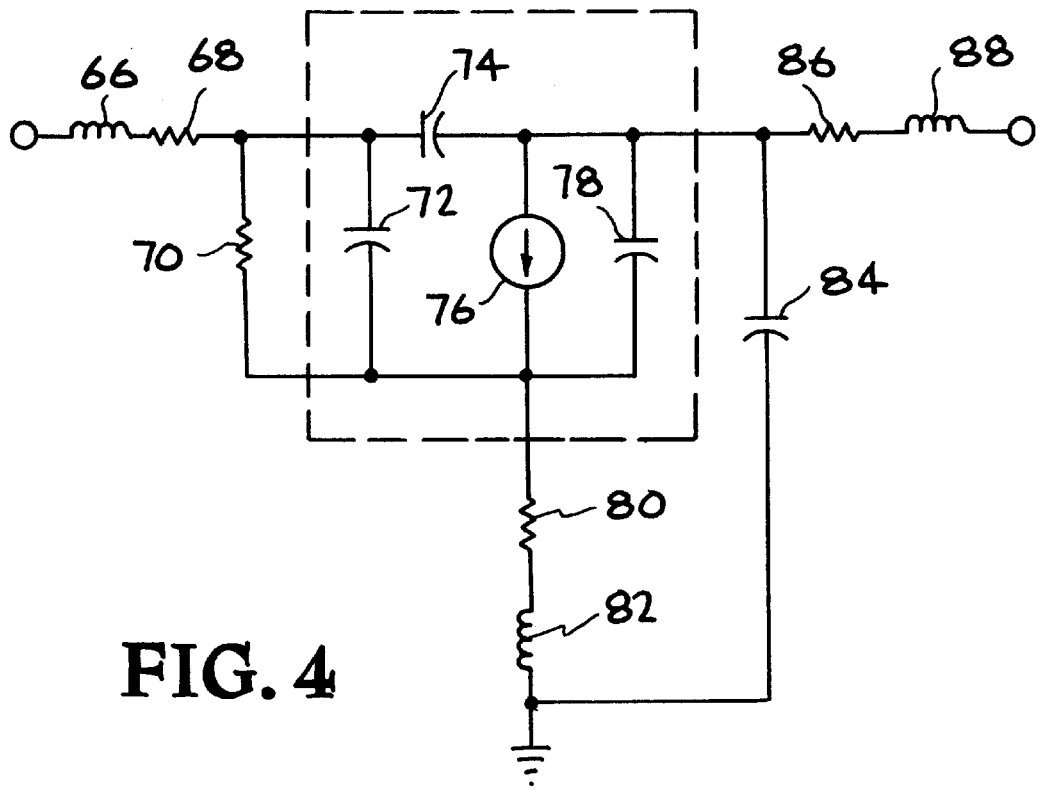
FIG. 4 shows the MESFET model used in SPICE.
Figure 5:
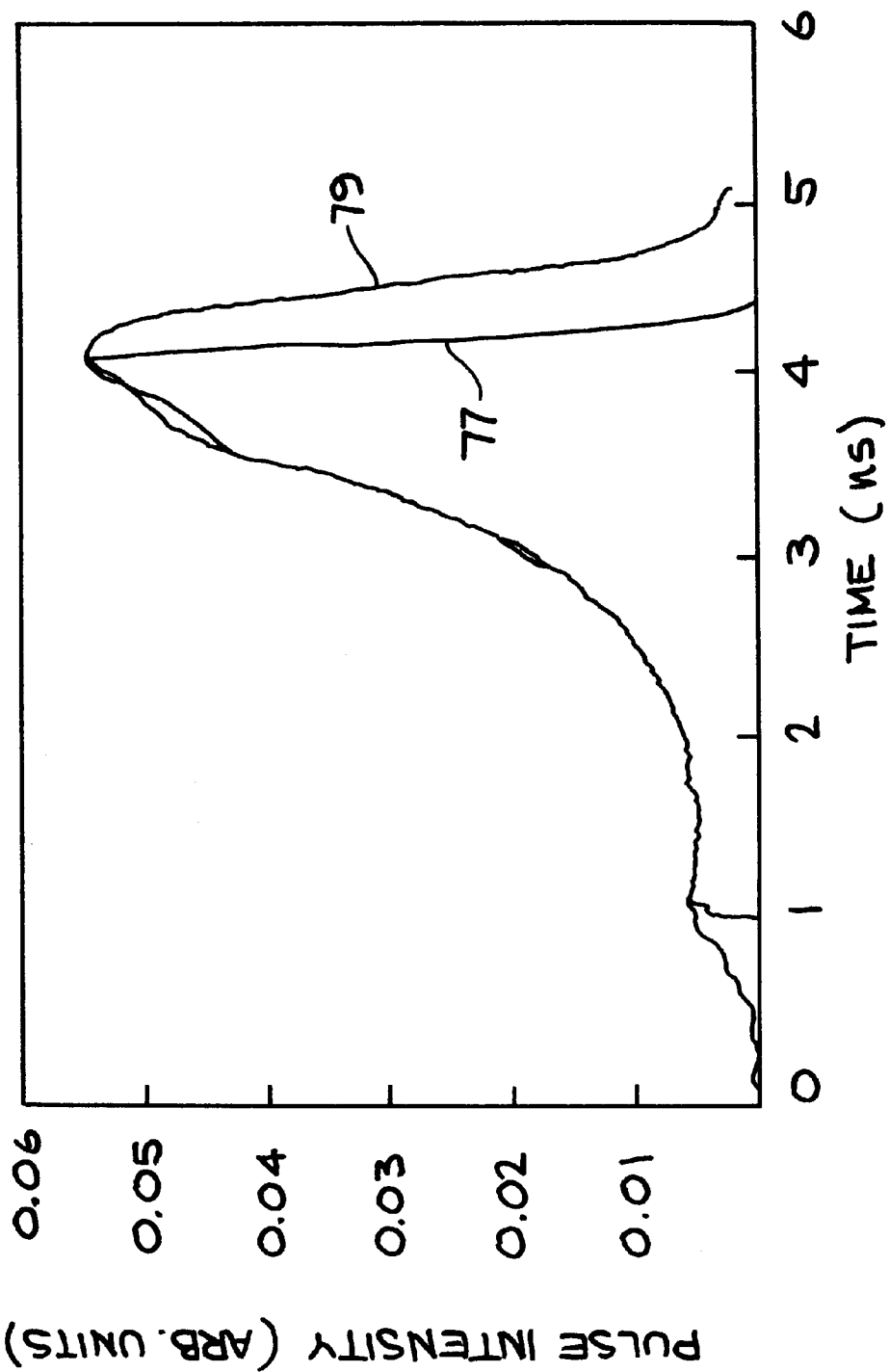
FIG. 5 shows a measured optical pulse compared to the desired pulse which the system was programmed to generate.

FIG. 4 shows the standard circuit model used for GaAs—FET circuit modeling. Of particular importance are the parasitic capacitances Cds (78), Cdg (84), and Cgd (74). These capacitances determine how closely the gasfets can be spaced along the pulse line. To maintain pulse fidelity between the pulse line and the output 50 ohm impedance, the line impedance is increased local to the GaAs—FET drain so that the transmission line and shunt capacitors form a 50 Ω impedance. This suppresses reflections at both ends of the pulse line to minimize crosstalk between the individual impulses. The model shown in FIG. 4 includes gate inductor 66, gate resistor 68, gate source resistance 70, source resistor 80, source inductor 82, drain resistor 86, drain inductor 88, GASFET active element 76 and gate source capacitance 72. Similar approaches have been used in the past in distributed amplifiers; however the purpose here is different because it is really used to minimize the discontinuity due to the gasfet connection to the pulse line. FIG. 5 shows an overlay of a desired pulse 77 and a measured pulse 79.

Modeling was done using NEC NE900200 devices which were designed for use in microwave power amplifiers at frequencies up to 20 GHz, and have a low drain-source capacitance, and a low drain-ground capacitance. Simulation of this device was done using a combination of behavioral and physical models. There exists at least five different equivalent circuit models created by various researchers starting with the Curtice model in 1980. The model used here was developed by Statz et al., in 1987. It has several advantages over the basic Curtice model, such as improved accuracy for modeling the drain-source current (Ids) for large gate-source voltages (Vgs), and the improved gate-drain and gate-source capacitance model (Cgd and Cgs) for the Statz model. But all the models have a drain current response which basically follows the square law.

$$Ids = \underbrace{\frac{B(Vgs - V_{TO})^2}{1 + b(Vgs - V_{TO})}}_{A} \left[ 1 - \underbrace{\left(1 - \frac{\alpha Vds}{3}\right)^3}_{B} \right] \underbrace{\left(1 + \lambda Vds\right)}_{C}$$

Briefly, part A of the equation models the square law dependence of Igs for small $V_{gs}-V_{TO}$ (where $V_{TO}$ is the MESFET punch-off voltage). For larger $V_{gs}-V_{TO}$, the dependence becomes nearly linear. Part B models the transition from Vds=0 v to where charge carries saturation velocity occurs at Vds~1 v. Part C of the equation accounts for the resistive behavior during saturated operation. The manufacturer's numbers and SPICE defaults were relied on to set the parameters as shown in Table 1 and alternatively calculated from the manufacturer's supplied s-parameters.

TABLE 1

MESFET Parameters used in the Statz model in SPICE

| Parameter | Value | Parameter | Value |
|---|---|---|---|
| b | .012 V/A² | Rd | 1.8 Ohm |
| $V_{TO}$ | −3.5 V | Ls | 18 pHy |
| b | 0.3 V⁻¹ | Rs | 0.9 Ohm |
| a | 2.0 V⁻¹ | Rgs | 4.0 k-ohm |
| l | 0.1 V⁻¹ | Cdg | 0.25 pF |
| Lg | 12 pHy | Cgd | 0.084 pF |
| Rg | 0.49 Ohm | Cgs | 1.61 pF |
| Ld | 12 pHy | Cds | 0.13 pF |

As described earlier, the trigger line impedance was matched at each gasfet, resulting in a gradually increasing trigger line impedance. The other modification to this circuit was to account for the gate-drain and drain-ground capacitances. The drain-ground capacitance is 0.25 pF, which is enough to cause a significant reflection of a wavelet passing by the MESFET drain connection. Added to that is the drain-gate capacitance of 0.13 pF, which approximately adds to the drain-ground capacitance depending upon the gate waveform. This shunt capacitance is compensated by reducing the pulse transmission line capacitance local to the drain connection. This was accomplished by a prescribed pulse line impedance for the section where the GaAs-FETS were connected, such that the lumped impedance including parasitic capacitance equaled 50 ohms.

Figure 6:
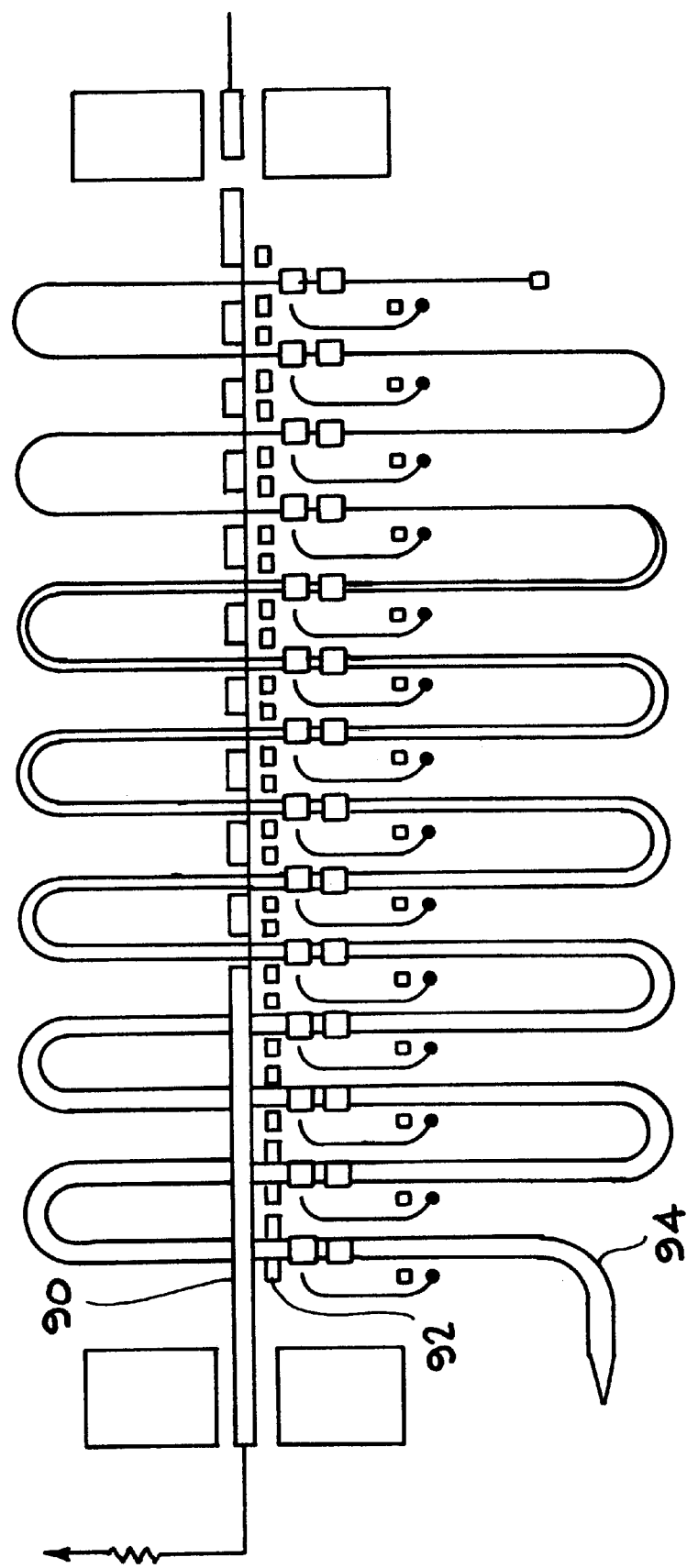
FIG. 6 shows a four-layer printed circuit board fabricated to generate 3.5 ns pulses, and used to generate the desired pulse shown in FIG. 5.

The pulse generator has been reduced to practice in a form similar to that modeled. A four-layer printed circuit board was fabricated as shown in FIG. 6 to generate 3.5 ns pulses. The pulse line 90 is biased at 4 V, and the impulses are imparted on the line by the gasfets which are mounted at the 14 locations (92) and triggered by the trigger line 94. For this circuit, the transmission line impedance starts at 25 Ω, and increases at each gasfet to maintain a constant amplitude trigger. Measurements showed that the trigger pulse amplitude was maintained. The circuit demonstrated the performance shown in FIG. 5 for shaped pulses, and experiments with a 60 ps trigger pulse demonstrated performance to 9 GS/s.

Changes and modifications in the specifically described embodiments can be carried out without departing from the scope of the invention, which is intended to be limited by the scope of the appended claims.

What is claimed is:

1. An apparatus, comprising:
   a pulse transmission line; means for providing electrical impulses on said pulse transmission line, wherein said means are electrically matched to the transmission parameters of said pulse transmission line to provide distortion free propagation; and
   wherein said means for providing electrical impulses on said pulse transmission line comprise:
   a plurality of switching devices;
   means for triggering said plurality of switching devices; wherein said plurality of switching devices are electrically connected between said pulse transmission line and said means for triggering said plurality of switching devices.

2. The apparatus of claim 1, wherein said means for providing electrical impulses comprises means for controlling the relative amplitude of an impulse imparted on said pulse transmission line.

3. The apparatus of claim 2, wherein said means for controlling the ralative size of an impulse comprise a computer.

4. The apparatus of claim 1, wherein said means for triggering said plurality of switching devices comprise a trigger line.

5. The apparatus of claim 1, wherein said means for triggering said plurality of switching devices comprise individual triggers capable of variation in pulse width and timing to vary the data transmission rate imparted on said pulse transmission line.

6. The apparatus of claim 4, wherein said trigger line is impedance matched for efficient use of a trigger pulse on said trigger line.

7. The apparatus of claim 1, wherein the impedance of said transmission line is modified to compensate for parasitic capacitance of said switching device.

8. The apparatus of claim 4, wherein the impedance of said trigger line increases with every subsequent switching device of said plurality of switching devices, in the forward direction of a trigger pulse produced by said means for triggering said plurality of switching devices.

9. A pulse-shape generator/multiplexer, comprising:
   a pulse transmission line for transmission of pulses at a pulse transmission frequency of at least 1 GHz;
   a trigger line; and
   a chain of high speed transistors, wherein said chain is electrically connected between said pulse line and said trigger line.

10. A method for multiplexing pulses, comprising:
    replicating versions of a trigger pulse to produce replicated scaled trigger pulses; and
    combining said replicated trigger pulses, delayed in time, modulated by high-bandwidth bias pulses, on a pulse transmission line, to produce combined arbitrary amplitude high speed data pulses, wherein said pulse transmission line is for transmission of pulses at a pulse transmission frequency of at least 1 GHz.

* * * * *